(12) United States Patent
Honma

(10) Patent No.: US 8,085,639 B2
(45) Date of Patent: Dec. 27, 2011

(54) INFORMATION REPRODUCING DEVICE

(75) Inventor: Hiromi Honma, Tokyo (JP)

(73) Assignee: NEC Corporation, Tokyo (JP)

( * ) Notice: Subject to any disclaimer, the term of this patent is extended or adjusted under 35 U.S.C. 154(b) by 130 days.

(21) Appl. No.: 12/448,533

(22) PCT Filed: Dec. 11, 2007

(86) PCT No.: PCT/JP2007/073827
§ 371 (c)(1),
(2), (4) Date: Jun. 24, 2009

(87) PCT Pub. No.: WO2008/078545
PCT Pub. Date: Jul. 3, 2008

(65) Prior Publication Data
US 2010/0091624 A1    Apr. 15, 2010

(30) Foreign Application Priority Data
Dec. 27, 2006  (JP) .................. 2006-351372

(51) Int. Cl.
*G11B 7/00* (2006.01)
(52) U.S. Cl. .............. 369/59.21; 369/47.28; 369/53.35; 369/59.22
(58) Field of Classification Search .............. None
See application file for complete search history.

(56) References Cited

U.S. PATENT DOCUMENTS

| 5,848,047 | A   | 12/1998 | Fujimoto |
| 6,304,538 | B1* | 10/2001 | Hayashi ............. 369/59.22 |
| 6,674,707 | B2  | 1/2004  | Ogura et al. |
| 2005/0094751 | A1* | 5/2005 | Serizawa ............. 375/346 |
| 2006/0007834 | A1  | 1/2006 | Moriwaki |
| 2006/0012438 | A1* | 1/2006 | Chou et al. ............. 331/16 |

FOREIGN PATENT DOCUMENTS

| JP | 10-027435     |   | 1/1998 |
| JP | 2001-096283 | A | 3/2004 |
| JP | 2004-095283 | A | 3/2004 |
| JP | 2006-024265 | A | 1/2006 |
| JP | 2006-040458 | A | 2/2006 |
| JP | 2006-134501 | A | 5/2006 |

OTHER PUBLICATIONS

IB of WIPO, International Preliminary Report on Patentability, PCT/JP2007/073827,Sep. 17, 2009, 4 pages.

* cited by examiner

*Primary Examiner* — Joseph Haley
(74) *Attorney, Agent, or Firm* — Foley & Lardner LLP

(57) ABSTRACT

An A/D converter samples a read signal in synchrony with a system clock sclk having a fixed frequency, to perform an A/D conversion. A fluctuation compensator is configured as an internal-feedback-type compensation filter, and suppresses fluctuation of a digital signal output from the A/D converter. A digital PLL uses an interpolator to generate, by interpolation, a sampled value of the read signal at a timing in synchrony with a channel frequency, and uses NCO to generate a synchronizing clock and an interpolated-phase signal that is fed back to the interpolator. A binarization circuit binarizes the read signal based on the interpolated value output from the interpolator. The frequency characteristic of the fluctuation compensator is controlled based on the frequency value output from the loop filter.

8 Claims, 9 Drawing Sheets

INFORMATION REPRODUCING DEVICE

TECHNICAL FIELD

The present invention relates to an information reproducing apparatus and, more particularly, to an information reproducing apparatus that reproduces information from a signal read out from an optical disc etc.

BACKGROUND ART

Due to recent spread of CDs and DVDs, it is ordinary for an individual person to record a large amount of information on an optical disk medium or reproduce information from the optical disk medium. These digital data are recorded as a minute mark train along with a guide groove of a spiral shape formed on the optical disc medium. Upon reproducing the data, a reflected light, i.e., laser beam irradiated onto and reflected from the medium surface is converted into an electric signal (referred to as reproduced signal hereinafter), to which a variety of filtering processings or decoding processings are applied to thereby create a 1-bit digital information train.

In order to obtain a 1-bit digital information train from the reproduced signal, it is needed to first extract a clock in synchrony with the reproduced signal from the reproduced signal. This is because a deviation of central axis etc. of the disk slightly deviates the channel route of the reproduced signal even if the rotation of the spindle is correct, to thereby deviate the position to be identified if a fixed-frequency clock timing is employed. For this reason, the clock in synchrony with the reproduced signal is extracted by using a circuit referred to as PLL (phase locked loop). The reproduced signal is binarized and extracted at this synchronizing timing by using, for example, a specific threshold, to obtain the 1-bit digital information train. This digital information train is demodulated, and thereafter subjected to error correction etc. to finally provide the image and/or music information.

An ordinary PLL has a basic configuration including three elements including a phase comparator, a loop filter, and a voltage-controlled oscillator (VCO). In the PLL, the phase comparator generates a phase difference between the input signal and an output of the VCO, the loop filter removes harmonic components and noise component in the phase difference, and a feedback loop that controls the frequency of the VCO is formed based on the output of the loop filter. This feedback loop allows the output of the VCO to operate in synchrony with the input signal.

Assuming that the transfer characteristics of the phase comparator, loop filter and VCO are Kp, F(s) and Kv/s, respectively, the open-loop transfer characteristic G(s) of the PLL is expressed by the following formula (1):

$$G(s) = Kp \cdot Kv \cdot F(s)/s \quad (1)$$

The closed-loop transfer characteristic H(s) thereof is expressed by the following formula (2):

$$H(s) = G(s)/(1+G(s)) \quad (2)$$

If the open-loop characteristic G(s) is of a first order, there is no frequency pull-in stage, whereby the pull-in range is narrow, and both the quick response and low jitter cannot be satisfied. For this reason, a secondary- or higher-order characteristic is employed for the transfer characteristic F(s) of the loop filter by using a lag-lead filter etc. Note that the loop characteristic is determined by resistors, capacitors etc. in many cases.

In the conventional analog PLL technique, it is difficult to mass-produce the PLLs having a uniform loop characteristic due to the factor that the characteristic, changes depending on the range of variety of parts and ambient temperature. In addition, there is a problem in the analog PLL that the characteristic degradation due to variation with time is unavoidable. There is digital PLL as the PLL that can avoid such a problem. The digital PLL is described in, for example, Patent Publication-1.

FIG. 11 shows the configuration of a reproducing apparatus that includes a conventional digital PLL. In the reproducing apparatus 500, an analog signal read from the optical disc etc. is sampled in synchrony with a system clock of a fixed frequency by an A/D converter 501. An interpolator 502 calculates, based on the PLL-clock-phase signal output from a PLL-clock-phase signal generator 506, a sampled value of the reproduced signal upon deviation of the sampling phase from the sampled values output from the A/D converter 501, by using a linear interpolation. A phase error detector 504 calculates phase shift information from the interpolated value output from the interpolator 502. This phase shift information is input to a loop filter 505 for suppression of the high frequency components, and thereafter input to the PLL-clock-phase signal generator 506.

The PLL-clock-phase signal generator 506 generates a PLL-clock-phase signal of a saw-tooth waveform based on the output of the loop filter 505. By controlling the phase of interpolator 502 based on this PLL-clock-phase signal, the interpolator 502 generates an interpolated value corresponding to the sampled value of read signal that is in synchrony with the channel clock. The interpolated value output from the interpolator 502 is input to a binarization circuit 503, and the recorded information is detected by the binarization circuit 503.

In the above configuration, the phase of sampling clock of the A/D converter 501 and the phase of channel clock of the read signal are independent of each other, and feedback of the PLL-clock-phase signal to the interpolator 502 allows the interpolator 502, phase error detector 504, loop filter 505, and PLL-clock-phase signal generator 506 to configure a PLL loop. This configuration allows those elements including an oscillator to be digitalized, whereby PLLs having the same characteristic and a higher resistance to the ambient change can be mass-produced. In addition, although it has been difficult to manufacture a PLL having a wider capture range because the analog VCO is non-linear, i.e., Kv is a non-linear function of "s", this digitalization will solve the above problem.

Next, disk rotational control will be described. There are mainly two techniques for the rotational control of a disk: a CLV (constant linear velocity) control technique that maintains the linear velocity constant, and a CAV (constant angular velocity) control technique that fixes the rotational angular velocity. It is assumed here that recording is performed on the medium, such as CD or DVD, at a constant linear density. In the CLV control, since the rotational speed of spindle changes by about 2.4 times between the inner periphery and the outer periphery, there arise problems that a random access is accompanied by a waiting time for the spindle control and that this causes a large amount of power dissipation. On the other hand, in the CAV control, since the spindle is rotated at a constant velocity, the waiting time needed for the rotational control is zero to thereby improve the accessibility. Due to these reasons, the number of apparatuses using the CAV control is increasing. However, if a disk on which recording is performed using the CLV control is subjected to the CAV control, the synchronizing clock frequency of the reproduced signal changes by about 2.4 times between the inner periphery and the outer periphery, to thereby require a PLL having wider lock range and capture range.

The phase comparator in the PLL detects the phase difference between the clock timing of the internal oscillator and the signal obtained by comparing the input signal against a specific threshold. The reproduced signal from the optical disk has a smaller slope of the edge for a higher recording density, due to the characteristic of the transmission path between the disk medium and the pickup. Thus, a deviation of the threshold for the comparison, if occurs, involves a phase deviation in the result of phase comparison, thereby causing a statistic phase error in the output synchronizing clock. The occurrence of phase deviation involves a deviation of the identification position for the data, whereby the statistic phase error increases the possibility of occurrence of an error in the identification of data.

The deviation of comparison threshold occurs mainly due to a low-frequency component included in the reproduced signal. The low-frequency fluctuation in the recorded code itself is avoided by providing a plurality of synchronizing patterns inserted periodically, and recording a synchronizing pattern that is selected so that the ratio of number of "0s" to number of "1s" right before the synchronizing pattern assumes a constant. However, this technique cannot completely suppress the low-frequency fluctuation, whereby a fluctuation occurs due to a disturbance of the positional control system for the reading-use beam, a defect on the disk etc.

In order to solve the problem of the above fluctuation, it is common to provide a HPF (high-pass-filter) on the preceding stage of the PLL for adding thereto the function of removing the noise of a low-frequency range (for example, refer to Patent Publication-2). FIG. 12 shows the configuration of the information reproducing apparatus described in Patent Publication-2. An analog signal read from an optical disc etc. is sampled by an A/D converter 511 at a clock timing generated by a VCO 518. The sampled value is input to a DC feedback circuit 512 for suppressing a DC fluctuation. Thereafter, it is input to a phase error detector 515 for generation of a phase error, and a high-frequency component is removed therefrom by a next-stage loop filter 516, to thereby output digital frequency information.

The digital frequency information output from the loop filter 516 is converted into an analog signal by a D/A converter 517, to control the oscillation frequency of the VCO 518. Operation of the A/D converter 511 based on the synchronizing clock output from the VCO 518 and control of the sampling phase of the A/D converter 511 by using the VCO 518 provides a PLL loop including the A/D converter 511 and DC feedback circuit 512. The output of DC feedback circuit 512 is input to a PR (partial-response) equalizer 513, and subjected to equalization to a desired PR channel. Thereafter, information of thereof is detected by a maximum-likelihood detector 514 by using this channel characteristic. In the information reproducing apparatus 510, addition of the HPF function, such as a DC feedback, before performing the phase comparison provides a stability for the phase synchronization characteristic without being affected by the DC level fluctuation, whereby stable information reproduction is achieved. Provision of the HPF on the preceding stage of the PLL also provides a similar effect.

Here, a higher cutoff frequency of the HPF provides a higher attenuation rate in the low-frequency range, to raise the stability of the PLL against the noise of low frequency band. However, an excessively higher cutoff frequency of the HPF raises the sensitivity to noise of higher frequency band on the contrary, thereby increasing jitter of the PLL synchronizing clock to cause an out-of-synchronization. Therefore, there is an optimum solution for the cutoff frequency of HPF. The low-frequency-band noise superimposed on the reproduced signal from the optical disc mostly depends on the information and shape of the medium surface, and includes mostly a component that is proportional to the ratio of the reproducing speed to the nominal speed. Therefore, there exists an optimum solution for the cutoff frequency of HPF with respect to the reproducing speed ratio. In the case of reproduction using the CAV technique, the disk linear speed changes by about 2.4 times between the inner periphery and the outer periphery, and thus in the reproduction using the CLV technique as well, a countermeasure for a speed change of $2.4^2=5.8$ times is needed in the case of reproducing before the spindle assumes a lower speed just after a long seeking operation. In these cases, it is preferable to change the cutoff frequency of HPF provided on the preceding stage of the PLL in accordance with the speed ratio.

Patent Publication-1: JP-1998-27435A
Patent Publication-2: JP-2006-40458A

The Information reproducing apparatus 510 described in Patent Publication-2 is configured as a phase synchronization loop including a HPF (DC feedback circuit 512). For this reason, the HPF having a digital configuration operates based on the clock that is in synchrony with the input signal, and the loop characteristic also changes depending on the speed ratio. However, in the information reproducing apparatus 510 described in Patent Publication-2, insertion of the HPF in the PLL loop increases the loop delay of the PLL, to thereby incur the problem that the tracking performance of the PLL is degraded. Improvement of the tracking performance may be achieved by raising the loop band of the PLL; however, there arise the problem of weakness against noise in such a case. In the case of a configuration wherein the HPF is provided outside the PLL loop, the delay of PLL loop may be alleviated; however, the HPF loop characteristic in accordance with the speed ratio cannot be assured.

SUMMARY OF THE INVENTION

It is an object of the present invention to solve the above problems in the conventional technique and to provide an information reproducing apparatus that can stably detect information even during a CAV reproduction, without increasing the PLL loop delay.

The present invention provides an information reproducing apparatus that reproduces digital information from an analog signal including a changing channel frequency, including: an A/D converter that samples the analog signal in synchrony with a system clock having a fixed frequency, to convert the same into a digital signal; an internal-feedback-type fluctuation compensator that suppresses fluctuation of the digital signal output from the A/D converter; a digital PLL that generates a sampled value of the analog signal at a timing in synchrony with the channel frequency by using interpolation from the digital signal output from the fluctuation compensator, generates a synchronizing clock having the channel frequency based on an interpolated value generated by the interpolation, and generates an interpolated-phase signal for use in the generation using the interpolation; and a demodulator that identifies the digital information based on the interpolated value and the synchronizing clock, wherein the frequency characteristic of the fluctuation compensator is controlled depending on the frequency of the synchronizing clock generated by the digital PLL.

The above and other objects, features and advantages of the present invention will be more apparent from the following description, referring to the accompanying drawings.

BEST MODE OF CARRYING OUT THE INVENTION

Figure 1:
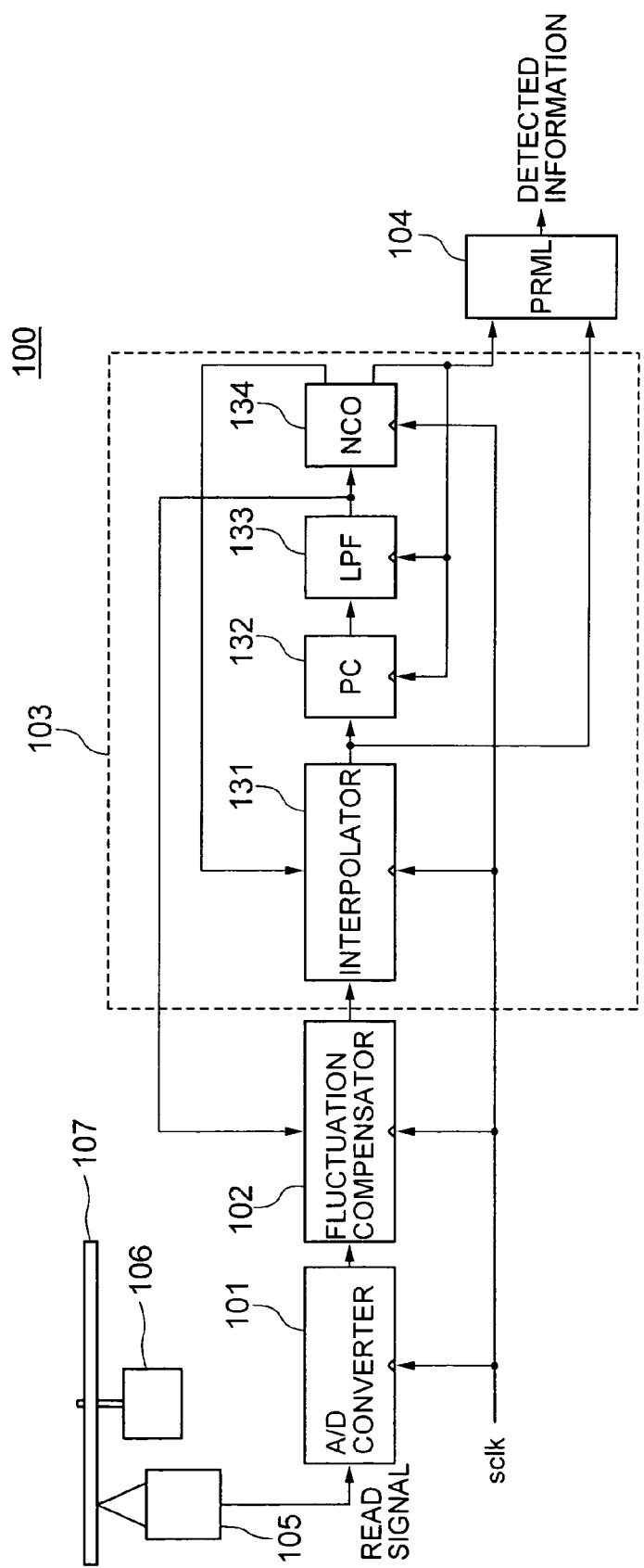
FIG. 1 is a block diagram showing the configuration of an information reproducing apparatus according to an embodiment of the present invention.

Hereinafter, an embodiment of the present invention will be described in detail with reference to the drawings. FIG. 1 shows the configuration of an information reproducing apparatus including a PLL circuit according to an exemplary embodiment of the present invention. The information reproducing apparatus 100 includes an A/D converter 101, fluctuation compensator 102, a digital PLL 103, a binarization circuit (demodulator) 104, an optical pickup 105, and a spindle motor 106. The digital PLL 103 includes an interpolator 131, a phase comparator 132, a loop filter 133, and a numerically-controlled oscillator (NCO) 134.

The spindle motor 106 rotates the optical disc medium 107. It is assumed here that information is recorded on the optical disc medium 107 at a constant linear velocity, and the rotational control technique of the spindle motor 106 is the CAV rotational control technique. The optical pickup 105 irradiates the recording surface of the optical disc medium 107 with a focused beam, receives the reflected light, and outputs an analog electric signal in accordance with the amount of the reflected light. The focused beam irradiated onto the recording surface is correctly positioned by an actuator servo, not shown, with respect to the disk surface along the focusing direction and tracking direction. The analog electric signal (read signal) output from the optical pickup 105 is amplified by a preamplifier not illustrated, subjected to high-frequency-band boosting equalization and band-limiting processing in an analog filter, and input to the A/D converter 101.

The A/D converter 101 samples the read signal in synchrony with a system clock (sampling clock) sclk, to output a digital signal. The system clock sclk is a clock signal of a fixed frequency that is independent of the channel clock phase of the read signal. It is assumed that the frequency of this system clock sclk is higher than the frequency of the synchronizing clock that is in synchrony with the read signal. More specifically, the A/D converter 101 samples the read signal by an over-sampling. The reason for the frequency of system clock sclk being higher than the frequency of the synchronizing clock is that it is generally difficult to insert data into the sampled data train including a smaller number of data whereas it is easy to extract data after the over-sampling.

The over-sampled digital signal that is output from the A/D converter 101 is input to the fluctuation compensator 102. The fluctuation compensator 102 suppresses a variety of fluctuations in the input digital signal. In order to suppress the DC fluctuation in particular, a configuration wherein the fluctuation compensator 102 includes the HPF, if employed, provides a significant advantage. The fluctuation compensator 102 may additionally include an AGC (auto gain controller) for suppressing an amplitude fluctuation. A filter may also be added that suppresses a deviation of asymmetry. The digital signal for which a variety of fluctuations are suppressed by the fluctuation compensator 102 is input to the interpolator 131. The interpolator 131 generates by interpolation, based on the input digital signal and interpolated phase information input from the NCO 134, a value equivalent to the value where the read signal is sampled at the timing in synchrony with the read signal.

The phase comparator 132 receives the interpolated value output from the interpolator 131, and generates a phase error between the synchronizing clock and the interpolated value. The phase error is input to the loop filter 133, wherein a high frequency component is suppressed to generate frequency information. The NCO 134 generates the synchronizing clock based on the frequency information input from the loop filter 133. The synchronizing clock output from the NCO 134 is equivalent to a clock signal wherein a clock pulse of the system clock sclk is periodically removed.

The NCO 134 also outputs an interpolated-phase signal having a saw-tooth waveform and representing the phase error between the sampling clock sclk and the synchronizing clock. The interpolated-phase signal output from the NCO 134 is fed back to the interpolator 131, whereby a PLL loop is configured so that the phase error assumes zero. In the information reproducing apparatus 100, the A/D converter 101, fluctuation compensator 102, interpolator 131 and NCO 134 are operated in synchrony with the system clock sclk, whereas the phase comparator 132 and loop filter 133 are operated in synchrony with the synchronizing clock output from the NCO 134.

The digital signal train that is in synchrony with the channel clock with which the interpolator 131 is synchronized is input to the binarization circuit 104, wherein the information is detected. The binarization circuit 104 may preferably be configured as a circuit for detecting binary data by using a maximum-likelihood detection, such as PRML. Note that, as a method for detecting the binary data in the binarization circuit 104, a technique other than the maximum-likelihood detection can also be used. The frequency information output from the loop filter 133 is input to the fluctuation compensator 102, which controls the frequency characteristic of the compensation filter based on the input frequency information. Since the fluctuation compensator 102 is provided outside the PLL loop, there occurs no influence on the loop delay if the three elements including the HPF, AGC and asymmetry compensator are connected in cascade as a compensation filter.

Although the information reproducing apparatus 100 is described above as an optical-disk-use information reproducing apparatus that reproduces information from an optical disc, the information reproducing apparatus 100 is not limited to an optical-disk-use information reproducing apparatus. The signal input to the A/D converter 101 may be a signal reproduced from a magnetic disk, or may be an analog signal transmitted using another baseband transmission system.

Figure 2:
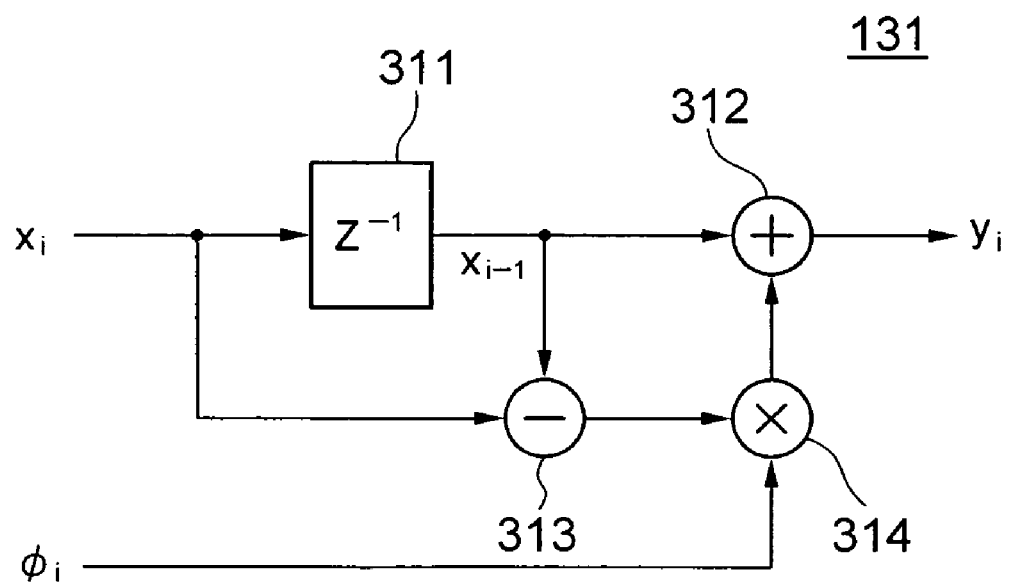
FIG. 2 is a block diagram showing the configuration of the interpolator.

FIG. 2 shows the configuration of the interpolator 131. The interpolator 131 includes a delay unit (latch circuit) 311, an adder 312, a subtractor 313, and a multiplier 314. The interpolator 131 generates an interpolated value $y_i$ based on the input signal $X_i$ input from the fluctuation compensator 102, signal $X_{i-1}$ obtained by delaying the input signal $X_i$ in the delay unit 311 by one clock of the sampling clock sclk and the interpolated phase $\phi_i$ input from the NCO 134. The interpolated phase $\phi_i$ is normalized by $2\pi$ whereby $0 \leq \phi_i < 1$. The interpolated value $y_i$ output from the interpolator 131 having the configuration shown in FIG. 2 may be expressed by the following formula (3):

$$y_i = x_{i-1} + (x_i - x_{i-1}) \times \phi_i \qquad (3).$$

In the configuration shown in FIG. 2, the interpolator 131 generates the interpolated value by a linear interpolation; however, the interpolated value may be generated using a higher-order function such as a spline interpolation. Although use of the high-order function can raise the interpolation accuracy, the linear interpolation is generally sufficient.

Figure 3:
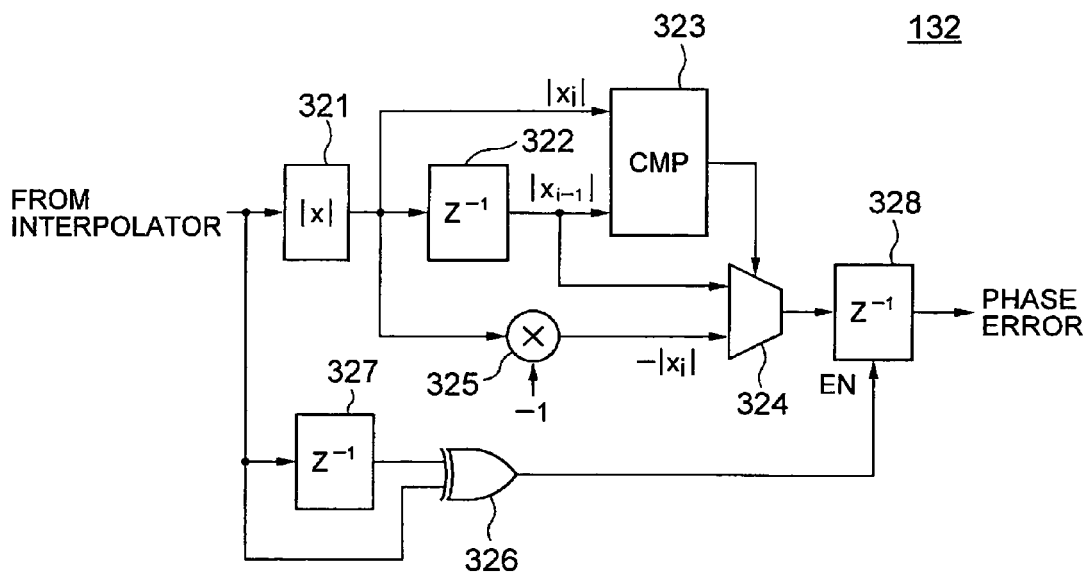
FIG. 3 is a block diagram showing the configuration of the phase comparator.

FIG. 3 shows the configuration of the phase comparator 132. The phase comparator 132 detects a change timing of the polarity based on the interpolated value (digital signal train) output from the interpolator 131, and generates the phase error from the amplitude value of the digital signal at that timing. The digital signal input to the phase comparator 132 is subjected to calculation of the absolute value thereof in an absolute-value calculator 321. A latch circuit (delay unit) 322 operates in synchrony with the synchronizing clock, and delivers the absolute value output from the absolute-value calculator 321 after delaying the same by one clock of the synchronizing clock.

A phase comparator 323 compares the absolute value $|X_i|$ output from the absolute-value calculator 321 against the absolute value $|X_{i-1}|$ one clock before output from the delay unit 322. A selector 324 is fed with a value $(-|X_i|)$ that is obtained by multiplying the absolute value $|X_i|$ output from the absolute-value calculator 321 by "−1" in a multiplier 325, and the absolute value $|X_{i-1}|$ one clock before output from the delay unit 322. The value output from the selector 324 is determined based on the comparison result in the comparator 323, whereby the selector 324 outputs $|X_{i-1}|$ if $|X_i| > |X_{i-1}|$ and outputs $-|X_i|$ if $|X_{i-1}| > |X_i|$.

On the other hand, a latch circuit 327 is fed with a bit representing the sign of the digital signal input to the phase comparator 132. The latch circuit 327 operates in synchrony with the synchronizing clock, and outputs the input sign bit after delaying the same by one clock. An exclusive OR 326 is fed with the sign bit of the present digital signal and sign bit one clock before input via the latch circuit 327. The exclusive OR 326 detects the time instant at which the sign is inverted, i.e., an edge of the input signal based on exclusive OR of the sign of the present input digital signal and sing of the input digital signal one clock before.

The output of the exclusive OR 326 is used as an enabling signal EN of a latch circuit 328, which latches the output of the selector 324 in synchrony with the synchronizing clock upon H-level of the enabling signal EN, i.e., at the timing of an edge of the input signal. The latch circuit 328 holds the latched output of the selector 324 until the enabling signal EN assumes an H-level for the next time. The phase comparator 132 outputs the data latched and held by the latch circuit 328 as the phase error signal.

The reproduced signal from an optical disk includes a variety of mixed frequencies, whereby if an ordinary PLL circuit is used for phase synchronization, the loop characteristic of the PLL is changed depending on the frequency of the phase comparison. In the phase comparator 132, the change of the PLL loop characteristic is prevented by holding the phase error in the latch circuit 328 at a timing other than the edge. Note that, if the latest phase error is maintained as it is for a long period of time during the time interval when the input signal is interrupted due to a defect etc. during data reproduction, the synchronizing clock frequency is considerably deviated, and thus a longer time is needed for the synchronization upon recovery of the input signal. For preventing this phenomenon, a function may be added wherein the latch circuit 328 is reset if the detected interval between edges exceeds a threshold, while using a counter for measuring the time interval of edge detection. The phase-difference-detection range of the phase comparator 132 having such a configuration is $\pm\pi$; however, another configuration may be employed wherein the phase frequency has a wider range.

Figure 4:
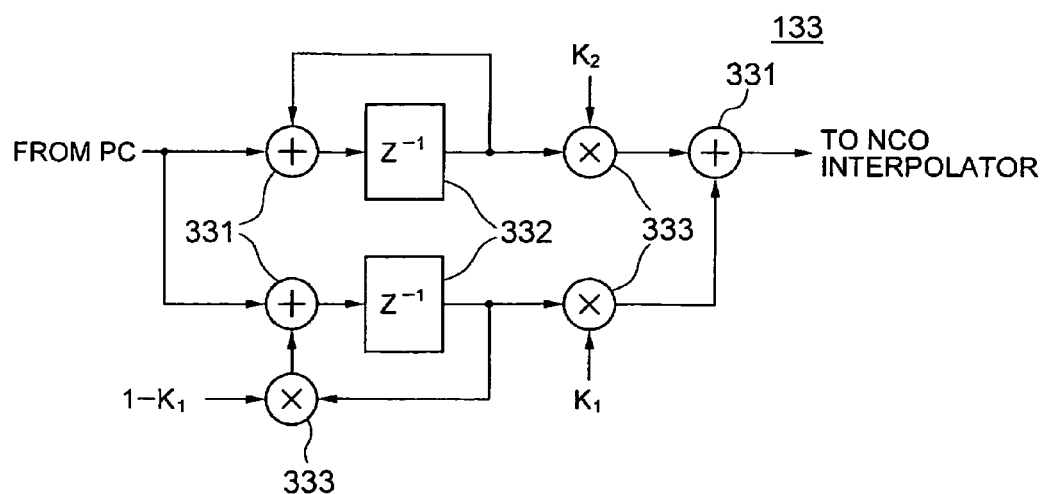
FIG. 4 is a block diagram showing the configuration of the loop filter.

FIG. 4 shows the configuration of the loop filter 133. The loop filter 133 includes an adder 331, a delay unit (latch circuit) 332 that delays the output thereof by one clock cycle, and a multiplier 333. Assuming $z = \exp(j\omega T)$ where T is the operating period of the digital circuit, the transfer function F(z) of the loop filter 133 having the configuration shown in FIG. 4 is expressed by the following formula (4):

$$F(z) = \{K_2 Z^{-1}/(1-Z^{-1})\} + K_1 Z^{-1}/\{1-(1-K_1)Z^{-1}\} \qquad (4).$$

In the formula (4), the first term corresponds to an integrator whereas the second term corresponds to a first-order low-pass-filter. The second term is not limited to the first-order low-pass-filter, and may be only $K_1$; however, a noise suppression effect for the higher frequency range is reduced in this case.

Figure 5:
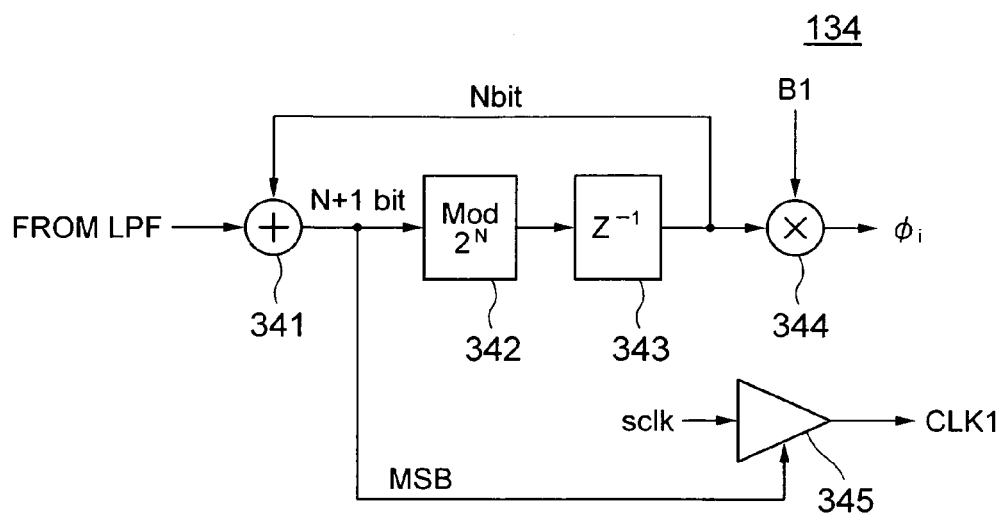
FIG. 5 is a block diagram showing the configuration of the numerically-controlled oscillator.

FIG. 5 shows an example of the configuration of NCO 134. An adder 341 adds the digital frequency value output from the loop filter 133 outputs and the output of a delay unit (latch circuit) 343, and outputs the same. Assuming that the delay unit 343 has a N-bit bus width and the digital frequency value has a N-bit or smaller bus width, the data output from the adder 331 has a (N+1)-bit bus width. The output of the adder 341 is input to a modulo calculator 342. The modulo calculator 342 outputs a remainder of the output of the adder 341 divided by 2N.

The delay unit 343 operates in synchrony with the system clock sclk, and delivers the remainder of the output of the modulo calculator 342 divided by 2N after delaying the same by one clock. A multiplier 344 multiplies the value output from the delay unit 343 by a fixed coefficient B1, and output the same. The NCO 134 delivers the output of the multiplier 344 as the interpolated-phase information. This interpolated-phase information assumes a saw-tooth waveform signal, wherein the period of the saw-tooth waveform changes in inverse proportion to the digital frequency value.

The most significant bit, MSB, of the (N+1)-bit value (without a sign) output from the adder 341 is used as an enabling signal EN of a gating member 345. The gating member 345 outputs the logical product of the sampling clock sclk and enabling signal EN. The enabling signal EN assumes a L-level only for the period corresponding to one out of ten clock pulses of the sampling clock sclk, for example, whereby the gating member 345 outputs a clock signal having a periodically-absent clock pulse as the synchronizing clock.

Each of the circuits operating in synchrony with the synchronizing clock may receive therein, instead of using the synchronizing clock generate by the NCO 134, the system clock sclk and the enabling signal EN generated by the NCO 134, generate a clock corresponding to the synchronizing clock in the each circuit, and use the same. However, it is practical to use the gating member 345 because of operation with a lower power dissipation.

Figure 6:
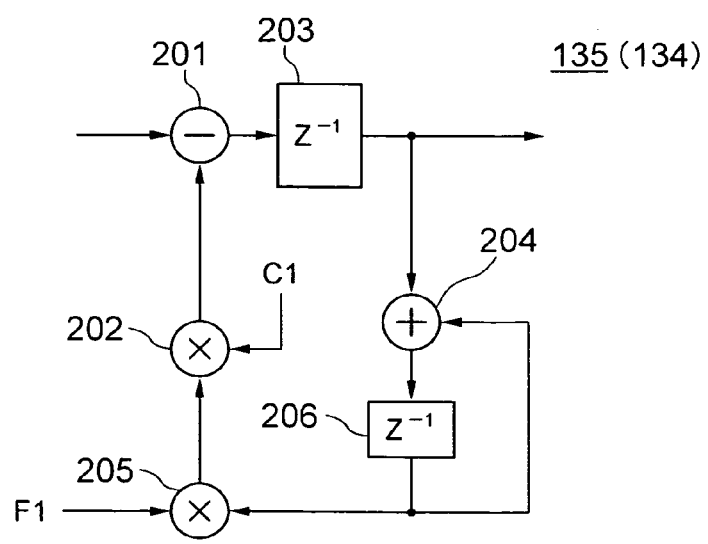
FIG. 6 is a block diagram showing the configuration of the HPF.

FIG. 6 shows the configuration of the HPF 135 provided in the fluctuation compensator 102. The output of the HPF 135 is integrated by an integrator configured by an adder 204 and a delay unit (latch circuit) 206. This integrated value is multiplied using multipliers 205 and 202 by a frequency value F1 and a fixed coefficient C1 output from the loop filter 133, respectively, and subjected to subtraction of the same from the input of the HPF in a subtractor 201, and the resultant output is fed back to the input. The output of the subtractor 201 latched by the latch circuit 203 is delivered as the output of the HPF 135. In this configuration, a higher input frequency value provides a higher closed-loop gain, thereby raising the cutoff frequency of the HPF. In another configuration, the loop gain of the closed loop is not controlled by the multiplier 205, whereby the integrator operates in synchrony with the synchronizing clock output from the digital PLL.

Figure 7:
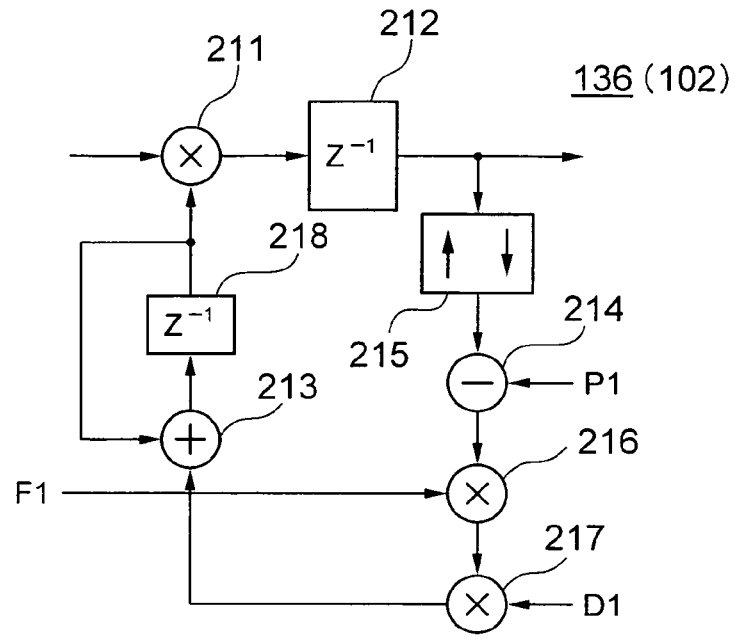
FIG. 7 is a block diagram showing the configuration of the AGC.

FIG. 7 shows the configuration of the AGC 136 included in the fluctuation compensator 102. The output of the AGC 136 delivered from a latch circuit 212 passes through an all-wave rectifier 215, and a subtractor 214 calculates the difference between the output of the all-wave rectifier 215 and the target amplitude value P1, to thereby generate an error. This error is multiplied by the frequency value F1 and fixed constant D1 output from the loop filter 133 in multipliers 216 and 217, respectively, and thereafter the resultant value is integrated in an integrator configured by an adder 213 and a delay unit (latch circuit) 218. This result is fed back to the input of the AGC 136 through a multiplier 211 to control the multiplied value so that the error assumes zero. In the configuration shown in FIG. 7, a higher frequency value F1 increases the AGC loop gain, thereby raising the cutoff frequency of the open loop characteristic.

Another configuration of the AGC may be such that the loop gain of the closed loop system is not controlled by the multiplier 216, and an integrator is operated in synchrony with the synchronizing clock output from the digital PLL. If the PLL is configured using the phase comparator 132 having the configuration shown in FIG. 3, the PLL loop gain is fluctuated in accordance with the input amplitude of the phase comparator 132. For this reason, it is preferable that the AGC be provided on the preceding stage of the phase comparator 132, to thereby maintain the input amplitude constant. In the information reproducing apparatus 100, the loop characteristic of the AGC is controlled depending on the channel clock frequency whereby there is provided an advantage that the characteristic has a smaller dependency on the radial position to thereby obtain a uniform reproducing characteristic.

Figure 8:
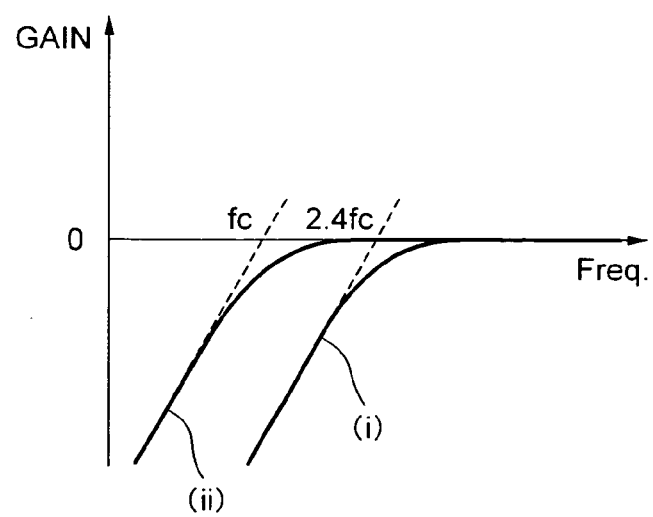
FIG. 8 is a graph showing the frequency characteristic of the HPF.

Operation of the information reproducing apparatus will be described hereinafter. It is assumed that information is reproduced from an optical disk medium 107 rotated in the CAV control. Assuming that the frequency value output form the loop filter 133 is FQ when the PLL is synchronized on the innermost periphery of the optical disk medium 107, the output frequency value of loop filter 133 when the PLL is synchronized on the outermost periphery is 2.4×FQ. FIG. 8 shows the frequency characteristic of the HPF 135 in the fluctuation compensator 102. Graph (i) represents the gain during reproduction on the outermost position, whereas graph (ii) represents the gain during reproduction on the innermost position. During reproduction on the innermost position, a frequency value of FQ is input to the fluctuation compensator 102, and this value is multiplied by the loop gain, to allow the cutoff frequency of HPF to assume fc. During reproduction on the outermost position, a frequency value of 2.4×FQ is input to the fluctuation compensator 102, and this value is multiplied by the loop gain to allow the cutoff frequency of HPF to assumes 2.4×fc. The cutoff frequency of the HPF is seamlessly controlled depending on the channel frequency to thereby realize a frequency characteristic in accordance with the channel frequency.

Figure 9:
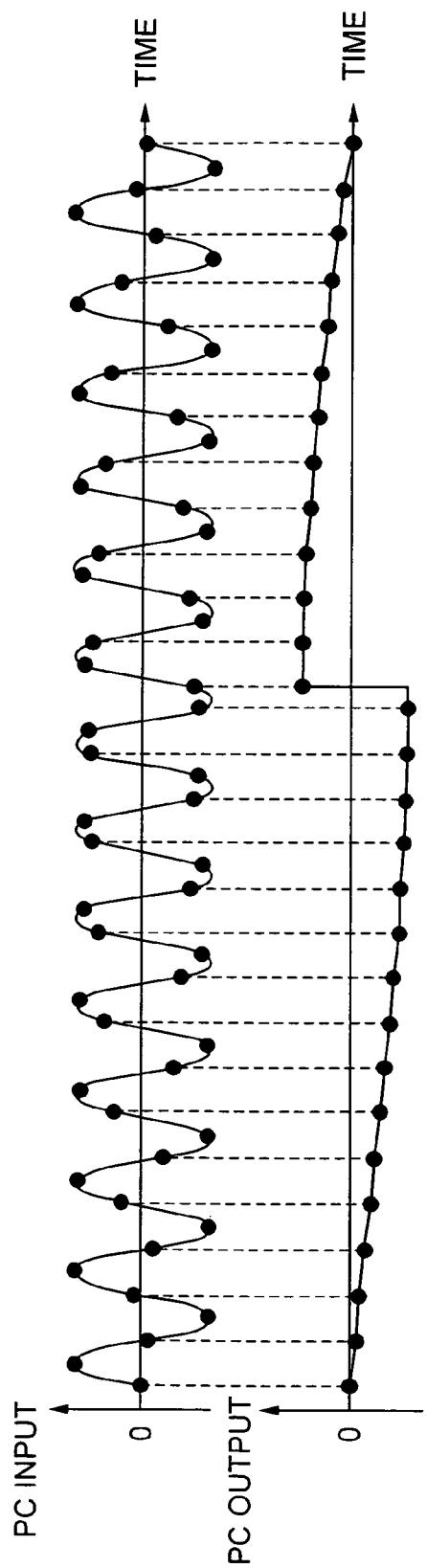
FIG. 9 is a waveform diagram showing the operating waveform of the phase comparator.

FIG. 9 shows the operating waveform upon input of continuous 2T-long mark/space signals to the phase comparator 132. The phase comparator 132 outputs the amplitude value of the input data train after correcting the sign thereof in the vicinity of an edge, due to the configuration shown in FIG. 3. When the detected phase difference reaches $-\pi$, it returns to $+\pi$ whereby the detection range is $\pm\pi$. In this configuration, since the output frequency changes depending on the input frequency, there may be a case where an amplitude fluctuation changes the loop characteristic after the PLL loop is formed. For preventing this phenomenon, an AGC may be provided on the preceding stage of the phase comparator.

Figure 10:
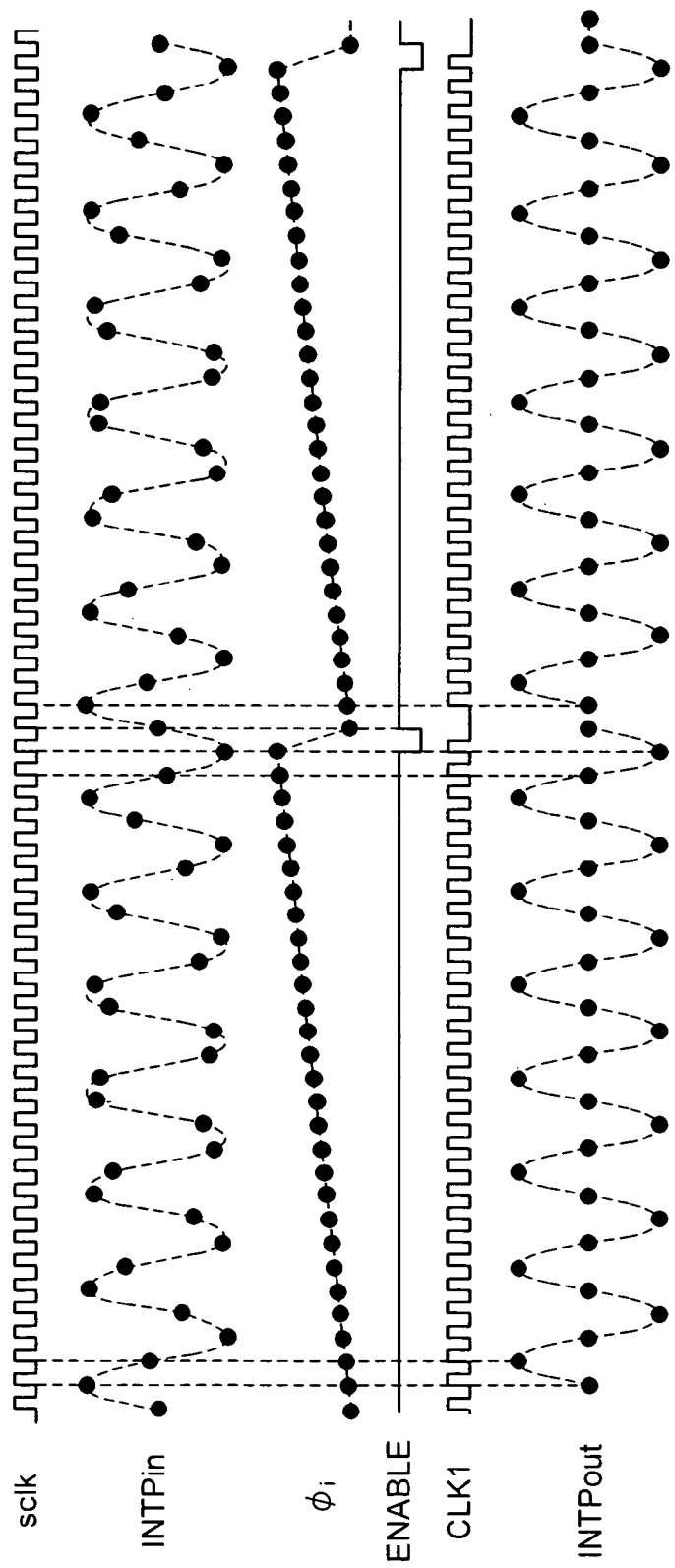
FIG. 10 is a waveform diagram showing the operating waveform of each part of the information reproducing apparatus.
Figure 11:
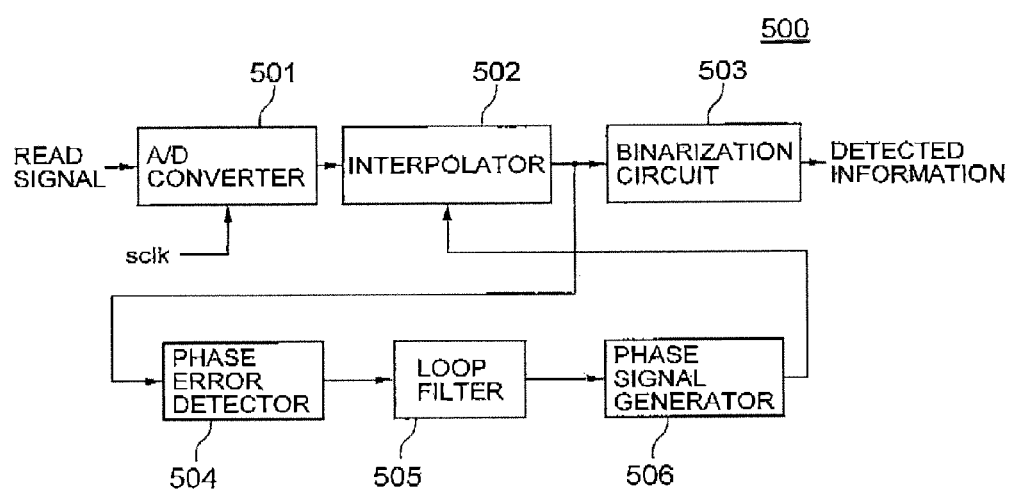
FIG. 11 is a block diagram showing the configuration of a conventional information reproducing apparatus.
Figure 12:
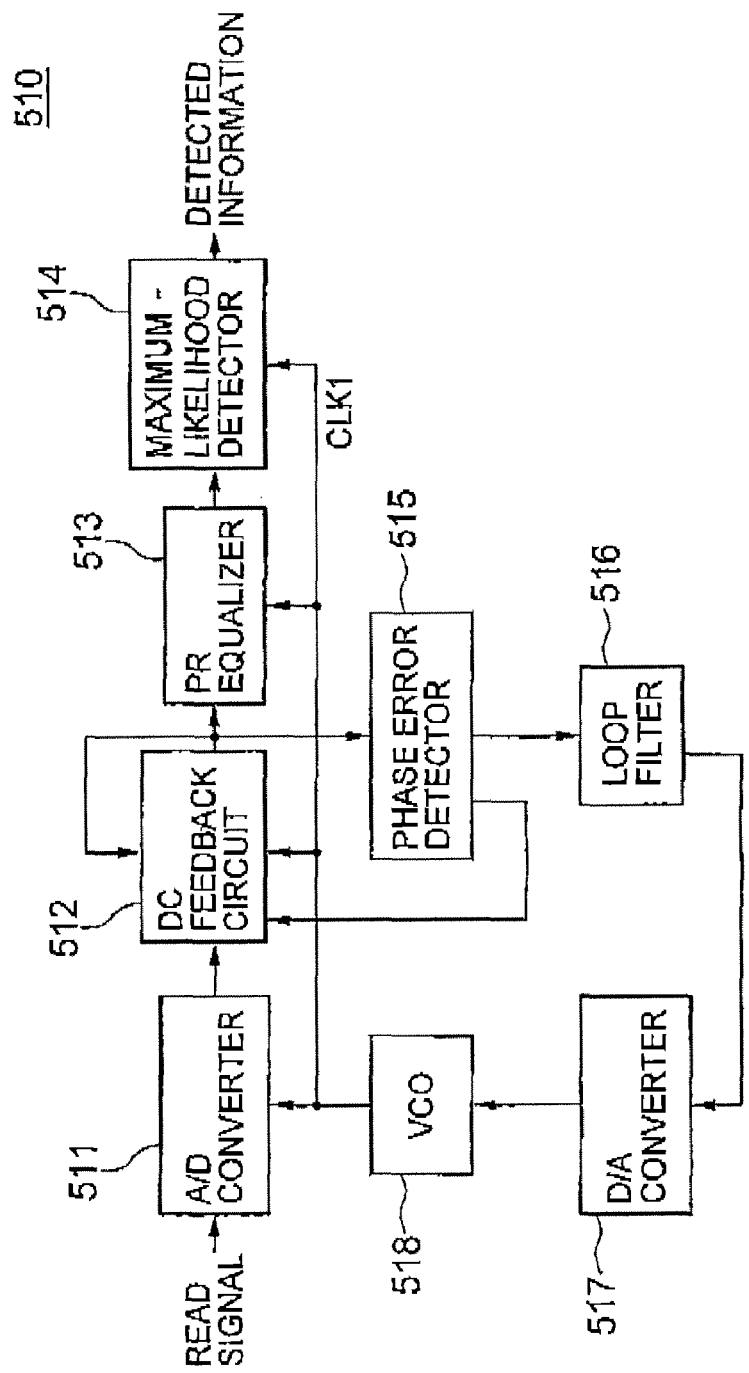
FIG. 12 is a block diagram showing the configuration of another conventional information reproducing apparatus.

FIG. 10 shows the operating waveform of each part in the information reproducing apparatus 100. In this figure, INTPin and INTPout represent the input and output, respectively, of the interpolator. In this example, the input signal is configured by continuous 2T-long mark/space signals. The A/D converter 101 samples in synchrony with the fixed frequency higher than the channel clock, to output the digital signal train that is not in synchrony with the channel clock. The interpolated phase $\phi_i$ input to the interpolator 131 represents an error between the timing of the synchronizing clock CLK1 and the timing of the system clock sclk, and changes in a saw-tooth waveform. The enabling signal ENABLE generated by the NCO 134 temporarily falls to a L-level at a discontinuous timing, after a continued H-level period. The gating member 345 does not deliver the clock pulse of the sampling clock sclk during the L-level period of the enabling signal ENABLE. Thus, the synchronizing clock CLK1 in synchrony with the channel clock frequency is obtained from the system clock sclk having a fixed frequency.

The interpolator 131 calculates an interpolated value corresponding to the sampled value at the time point of synchronization with the channel clock from the two adjacent sampling points and the interpolated phase $\phi_i$ by using the formula. By generating the interpolated value corresponding to the sampled value at the time of synchrony with the channel clock by using the interpolator, data equivalent to the data obtained by sampling in the A/D converter 101 based on the channel clock can be obtained. It is needed to determine the interpolation function in the interpolator 131 by taking into consideration the circuit scale and interpolation accuracy, and a first-order function can be used as such generally without a problem.

In the present embodiment, the fluctuation compensator 102 is provided outside the loop of the digital PLL 103. Thus, the PLL loop delay is small, and an excellent tracking characteristic can be obtained. In addition, provision of the fluctuation compensator 102 on the preceding stage of the digital PLL 103 and provision of the HPF function for the fluctuation compensator 102 can suppress the jitter of the synchronizing clock caused by low-frequency noise to a minimum. Due to control of the frequency characteristic of the fluctuation compensator 102 in accordance with the frequency value output from the loop filter 133, an excellent PLL tracking performance can be obtained even if the channel frequency significantly changes during the CAV reproduction.

Since the information reproducing apparatus 100 of the present embodiment can stably detect the information even during reproduction using the CAV control, it can be suitably used as an information reproducing apparatus for reproducing data from an optical disk. In addition, the PLL including the oscillator is digitalized in the present embodiment. Thus, PLLs having a uniform characteristic without variation with time and a temperature dependency can be mass-produced, for achieving mass-production of the information reproducing apparatus.

In the information reproducing apparatus according to the above exemplary embodiment, the PLL is configured as a digital PLL, and a fluctuation compensator is provided outside the PLL loop. By suppressing the fluctuation of the sampled data train (digital signal) sampled by the A/D converter by using the fluctuation compensator, the read signal can be correctly identified by a demodulator even in the case where the read signal has a fluctuation due to noise etc. Since the fluctuation compensator is provided outside the PLL loop in this case, the PLL loop delay is not increased by the fluctuation compensator, whereby fluctuation of the digital signal can be suppressed without incurring degradation of the tracking performance of the PLL. By controlling the frequency characteristic of the fluctuation compensator depending on the frequency of the synchronizing clock generated by the digital PLL, a fluctuation suppression characteristic in accordance with the channel frequency can be realized even when a change arises in the channel frequency, whereby stable information reproduction can be attained. By digitalizing the PLL including the oscillator, an information reproducing apparatus including the PLL having a uniform characteristic and little degradation with time can be obtained.

As described heretofore, the information reproducing apparatus of the present invention can employ the following configurations.

A configuration may be employed wherein the fluctuation compensator includes a HPF (high-pass-filter) having a cutoff frequency that is controllable from the frequency of the synchronizing clock. By suppressing the low-frequency noise in the digital signal output from the A/D converter by using the HPF, the phase synchronization characteristic of the digital PLL can be stabilized without being dependent on the DC level fluctuation, to achieve a stable information reproduction. In addition, control of the cutoff frequency of the HPF depending on the channel frequency achieves a suitable HPF characteristic during the CAV-control reproduction on the inner periphery and outer periphery.

A configuration may be employed wherein the fluctuation compensator includes an AGC (auto gain controller) that can control a loop characteristic from the synchronizing clock frequency. By maintaining constant the amplitude of the digital signal input to the digital PLL by using the AGC, change of the PLL loop characteristic due to the amplitude variation can be avoided.

A configuration may be employed wherein the digital PLL includes: an interpolator that generates the interpolated value based on the digital signal output from the fluctuation compensator and the interpolated-phase signal, a phase comparator that generates a phase error between the interpolated value generated by the interpolator and the synchronizing clock; a loop filter that generates the frequency value based on the phase error output from the phase comparator; and a numerically-controlled oscillator that generates the synchronizing clock and the interpolated-phase signal based on the frequency value output from the loop filter.

A configuration may be employed wherein the phase comparator detects an edge of the analog signal based on the interpolated value, and generates the phase error based on the interpolated value at a timing of detecting the edge. In this case, during the timing other than the edge timing, the phase error is maintained at a phase error at the edge timing, whereby change of the PLL loop characteristic can be prevented even in the case of a variety of mixed frequencies existing in the read signal.

A configuration may be employed wherein the loop filter includes an integrator and a first-order low-pass-filter. In this case, the loop filter suppresses the high-order noise of the phase error due to inclusion of the first-order low-pass-filter therein.

A configuration may be employed wherein the numerically-controlled oscillator includes: an adder that outputs an (N+1)-bit calculated result (N is a natural number); a modulo calculator that outputs a remainder of the output of the adder divided by 2N; a delay unit that delays the remainder output from the modulo calculator by one clock of the system clock; and a multiplier that multiplies an output of the delay unit by a fixed coefficient, wherein the adder adds the frequency value output from the loop filter and the remainder output from the delay unit, and feeds back the output of the adder as the interpolated phase signal to the interpolator. In addition, a configuration may be employed wherein the numerically-controlled oscillator generates the synchronizing clock based on a most significant bit of the (N+1)-bit addition result output from the adder and the system clock.

A configuration may be employed that further includes: a mechanism that performs CAV (constant angular velocity) rotational control of a disk medium on which information is recorded at a constant linear density; and a pickup unit that reads recorded information from the disc medium and delivers the read information as the analog information to the A/D converter. In the CAV control technique, the channel frequency of the read signal changes by about 2.4 times between the innermost periphery and the outermost periphery, and control of the frequency characteristic of the fluctuation compensator depending on the frequency of the synchronizing clock achieves a stable information reproduction during the CAV reproduction.

While the invention has been particularly shown and described with reference to exemplary embodiment thereof, the invention is not limited to these embodiments and modifications. As will be apparent to those of ordinary skill in the art, various changes may be made in the invention without departing from the spirit and scope of the invention as defined in the appended claims.

This application is based upon and claims the benefit of priority from Japanese patent application No. 2006-351372 filed on Dec. 27, 2006, the disclosure of which is incorporated herein in its entirety by reference.

The invention claimed is:

1. An information reproducing apparatus comprising:
   an A/D converter that samples an analog signal in synchrony with a system clock having a fixed frequency, to convert the analog signal into a digital signal, said analog signal including therein a channel clock having a variable channel frequency;
   an internal-feedback-type fluctuation compensator that suppresses fluctuation of the digital signal output from said A/D converter;
   a digital PLL that generates, from the digital signal output from said fluctuation compensator, a plurality of interpolated sampled values of the analog signal at respective timings in synchrony with the channel clock, and generates a synchronizing clock having the variable channel frequency based on the interpolated sampled values; and a demodulator that identifies the digital information based on the interpolated sampled values and the synchronizing clock, wherein said fluctuation compensator has a frequency characteristic that is controlled depending on the frequency of the synchronizing clock; and said fluctuation compensator comprises an AGC (auto gain controller) that can control a loop characteristic based on the frequency of the synchronizing clock.

2. The information reproducing apparatus according to claim 1, wherein said fluctuation compensator comprises a HPF (high-pass-filter) having a cutoff frequency that is controllable based on the frequency of the synchronizing clock.

3. The information reproducing apparatus according to claim 1, wherein said digital PLL comprises: an interpolator that generates the interpolated sampled values based on the digital signal output from said fluctuation compensator, a phase comparator that generates a phase error between the interpolated sampled values generated by said interpolator and the synchronizing clock; a loop filter that generates a frequency value based on the phase error output from said phase comparator; and a numerically-controlled oscillator that generates the synchronizing clock and an interpolated-phase signal representing a phase difference between the system clock and the variable channel frequency based on the frequency value output from said loop filter.

4. The information reproducing apparatus according to claim 3, wherein said phase comparator detects an edge of the analog signal based on the interpolated sampled value, and generates the phase error based on the interpolated sampled value at a timing of detecting the edge.

5. The information reproducing apparatus according to claim 3, wherein said loop filter includes an integrator and a first-order low-pass-filter.

6. The information reproducing apparatus according to claim 3, wherein said numerically-controlled oscillator comprises: an adder that outputs an (N+1)-bit calculated result (N is a natural number); a modulo calculator that outputs a remainder of the output of said adder divided by 2N; a delay unit that delays the remainder output from said modulo calculator by one clock of the system clock; and a multiplier that multiplies an output of the delay unit by a fixed coefficient, wherein said adder adds the frequency value output from said loop filter and the remainder output from said delay unit, and feeds back the output of said adder as the interpolated phase signal to the interpolator.

7. The information reproducing apparatus according to claim 6, wherein said numerically-controlled oscillator generates the synchronizing clock based on a most significant bit of the (N+1)-bit addition result output from said adder and the system clock.

8. The information reproducing apparatus according to claim 1, further comprising: a mechanism that performs CAV (constant angular velocity) rotational control of a disk medium on which information is recorded at a constant linear density; and a pickup unit that reads recorded information from the disc medium and delivers the read information as the analog information to said A/D converter.

* * * * *